(12) United States Patent
Brauer et al.

(10) Patent No.: US 11,580,650 B2
(45) Date of Patent: Feb. 14, 2023

(54) MULTI-IMAGING MODE IMAGE ALIGNMENT

(71) Applicant: KLA Corporation, Milpitas, CA (US)

(72) Inventors: Bjorn Brauer, Beaverton, OR (US); Vaibhav Gaind, Fremont, CA (US)

(73) Assignee: KLA Corp., Milpitas, CA (US)

( * ) Notice: Subject to any disclaimer, the term of this patent is extended or adjusted under 35 U.S.C. 154(b) by 238 days.

(21) Appl. No.: 17/030,194

(22) Filed: Sep. 23, 2020

(65) Prior Publication Data

US 2021/0097704 A1    Apr. 1, 2021

Related U.S. Application Data

(60) Provisional application No. 62/909,148, filed on Oct. 1, 2019.

(51) Int. Cl.
*G06V 10/25* (2022.01)
*G06T 7/33* (2017.01)

(52) U.S. Cl.
CPC ............... *G06T 7/337* (2017.01); *G06V 10/25* (2022.01); *G06T 2207/10061* (2013.01); *G06T 2207/30148* (2013.01)

(58) Field of Classification Search
CPC .......... G06T 7/337; G06T 2207/10061; G06T 2207/30148; G06V 2201/06; G06V 10/7515; G06V 10/25; G06K 2209/19; G06K 9/6203; G06K 9/3233
See application file for complete search history.

(56) References Cited

U.S. PATENT DOCUMENTS

| | | |
|---|---|---|
| 6,614,924 B1 | 9/2003 | Aghajan |
| 7,570,796 B2 | 8/2009 | Zafar et al. |
| 7,676,077 B2 | 3/2010 | Kulkarni et al. |
| 8,126,255 B2 | 2/2012 | Bhaskar et al. |
| 8,165,384 B1 * | 4/2012 | Ma .......................... G03F 1/70 382/238 |
| 8,664,594 B1 | 4/2014 | Jiang et al. |
| 8,692,204 B2 | 4/2014 | Kojima et al. |

(Continued)

FOREIGN PATENT DOCUMENTS

| | | |
|---|---|---|
| WO | 2014/153344 | 9/2014 |
| WO | 2017/117152 | 7/2017 |

OTHER PUBLICATIONS

International Search Report for PCT/US2020/053170 dated Jan. 15, 2021.

(Continued)

*Primary Examiner* — Carol Wang
(74) *Attorney, Agent, or Firm* — Ann Marie Mewherter

(57) ABSTRACT

Methods and systems for aligning images of a specimen generated with different modes of an imaging subsystem are provided. One method includes separately aligning first and second images generated with first and second modes, respectively, to a design for the specimen. For a location of interest in the first image, the method includes generating a first difference image for the location of interest and the first mode and generating a second difference image for the location of interest and the second mode. The method also includes aligning the first and second difference images to each other and determining information for the location of interest from results of the aligning.

19 Claims, 5 Drawing Sheets

(56) References Cited

U.S. PATENT DOCUMENTS

| | | |
|---|---|---|
| 8,698,093 B1 | 4/2014 | Gubbens et al. |
| 8,716,662 B1 | 5/2014 | MacDonald et al. |
| 9,092,846 B2 | 7/2015 | Wu et al. |
| 9,222,895 B2 | 12/2015 | Duffy et al. |
| 9,702,827 B1 | 7/2017 | Brauer et al. |
| 9,778,207 B2 | 10/2017 | Sousa et al. |
| 9,816,939 B2 | 11/2017 | Duffy et al. |
| 9,824,302 B2 | 11/2017 | Grbic et al. |
| 9,830,421 B2 | 11/2017 | Bhattacharyya et al. |
| 10,115,040 B2 | 10/2018 | Brauer |
| 10,295,476 B1 | 5/2019 | Kirshner et al. |
| 10,698,325 B2 | 6/2020 | Brauer |
| 2007/0156379 A1* | 7/2007 | Kulkarni ............ H01L 21/67005 703/14 |
| 2012/0296576 A1* | 11/2012 | Shibata ................ G01B 11/303 702/40 |
| 2013/0064442 A1 | 3/2013 | Chang et al. |
| 2015/0062571 A1 | 3/2015 | Kulkarni et al. |
| 2016/0150191 A1* | 5/2016 | Karsenti ............... H04L 67/306 382/149 |
| 2017/0140524 A1 | 5/2017 | Karsenti et al. |
| 2017/0148226 A1 | 5/2017 | Zhang et al. |
| 2017/0193400 A1 | 7/2017 | Bhaskar et al. |
| 2017/0193680 A1 | 7/2017 | Zhang et al. |
| 2017/0194126 A1 | 7/2017 | Bhaskar et al. |
| 2017/0200260 A1 | 7/2017 | Bhaskar et al. |
| 2017/0200264 A1 | 7/2017 | Park et al. |
| 2017/0200265 A1 | 7/2017 | Bhaskar et al. |
| 2017/0345140 A1 | 11/2017 | Zhang et al. |
| 2017/0345142 A1* | 11/2017 | Brauer .................... G06T 7/001 |
| 2017/0351708 A1* | 12/2017 | Lahmann .................. G06T 7/12 |
| 2017/0351952 A1 | 12/2017 | Zhang et al. |
| 2018/0005364 A1 | 1/2018 | Meeks et al. |
| 2018/0052118 A1* | 2/2018 | Duffy ................. G01N 21/9501 |
| 2018/0107928 A1 | 4/2018 | Zhang et al. |
| 2018/0293721 A1 | 10/2018 | Gupta et al. |
| 2018/0330511 A1 | 11/2018 | Ha et al. |
| 2019/0005629 A1 | 1/2019 | Dandiana et al. |
| 2019/0067060 A1 | 2/2019 | Plihal et al. |
| 2019/0073568 A1 | 3/2019 | He et al. |
| 2019/0108630 A1 | 4/2019 | Lin et al. |
| 2020/0193588 A1 | 6/2020 | Brauer et al. |
| 2020/0226744 A1* | 7/2020 | Cohen .................. G06T 7/0004 |

OTHER PUBLICATIONS

Lin et al., "Integrated Alignment and Inspection Platform for High Precision Optical Continuous Images," Smart Science, 2:4, 173-177, 2014.

U.S. Appl. No. 16/883,794 by Gaind et al. filed May 26, 2020 (submitted as U.S. Patent Application Publication No. 2021/0109041 published Apr. 15, 2021).

* cited by examiner

MULTI-IMAGING MODE IMAGE ALIGNMENT

BACKGROUND OF THE INVENTION

1. Field of the Invention

The present invention generally relates to methods and systems for aligning images of a specimen generated with different modes of an imaging subsystem.

2. Description of the Related Art

The following description and examples are not admitted to be prior art by virtue of their inclusion in this section.

Inspection processes are used at various steps during a semiconductor manufacturing process to detect defects on wafers to promote higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

Many inspection tools have adjustable parameters for many of the output (e.g., image) generation elements of the tools. The parameters for one or more elements (such as energy source(s), polarizer(s), lens(es), detector(s), and the like) may be altered depending on the type of specimen being inspected and the characteristics of the defects of interest (DOIs) on the specimen. For example, different types of specimens may have dramatically different characteristics, which can cause the same tool with the same parameters to image the specimens in extremely different ways. In addition, since different types of DOIs can have dramatically different characteristics, inspection system parameters that are suitable for detection of one type of DOI may not be suitable for detection of another type of DOI. Furthermore, different types of specimens can have different noise sources, which can interfere with detection of DOIs on the specimens in different ways.

The development of inspection tools with adjustable parameters has also led to the increasing use of inspection processes that involve scanning the specimen with more than one combination of parameter values (otherwise referred to as "modes") such that different defect types can be detected with different modes. For example, one mode may have a greater sensitivity for detecting one type of defect while another mode may have a greater sensitivity for detecting another type of defect. Therefore, using both modes, an inspection system may be able to detect both types of defects with acceptable sensitivity.

Several currently used methods are available for optical mode selection (OMS) to find the best mode for inspection. Mode selection can be relatively straightforward when an inspection process uses only one mode of the inspection tool. For example, a performance metric such as DOI capture vs. nuisance suppression can be compared for each mode to identify the mode that has the best performance. This process, however, becomes exponentially more complicated and difficult when more than one mode is used for inspection. For example, one could simply compare the performance metrics of different modes and then select the top two or more for inspection, but that would not necessarily result in an inspection process that is better than if only the top mode was used.

Instead, the impetus for using more than one mode for an inspection is generally that the inspection is relatively difficult to begin with, e.g., the DOIs are relatively difficult to separate from noise and/or the nuisances are relatively difficult to suppress. For such inspections, ideally, two or more modes would be complementary in some manner, e.g., such that the results produced by one mode could enhance the results produced by another mode. In one such example, even if the results produced by one mode are not in of themselves particularly "good," in the right circumstances, those results could be used to separate DOIs and nuisances in other results produced by another mode thereby enhancing the results produced by the other mode.

Oftentimes, such complementary modes are difficult to identify for a number of reasons. One such reason can be that the number of variable settings on an inspection tool is substantially large resulting in a substantial number of modes and an even greater number of mode combinations that can be evaluated. Some inspection mode selection processes aim to streamline this process by eliminating some modes or mode combinations before evaluation is even begun. Even still, the number of modes and mode combinations may be so large as to prohibit all of them from being evaluated.

Difficulties in selecting and using multiple modes for inspection or other image-based processes like defect review and metrology can also arise from the difficulty in aligning images from multiple modes to each other or otherwise identifying locations in images from different modes that correspond to the same location on the specimen. For example, as far as the inventors are aware, patch images of different modes coming from an optical inspector have never been aligned to each other before. Inter-mode image alignment is difficult if not impossible due to the differences in the images from different modes. In other words, the differences between images from multiple modes that make them useful for applications such as inspection, defect review, and the like also make it difficult to align the images to each other so that they can be used in a complementary way.

Accordingly, it would be advantageous to develop systems and methods for aligning images of a specimen generated with different modes of an imaging subsystem that do not have one or more of the disadvantages described above.

SUMMARY OF THE INVENTION

The following description of various embodiments is not to be construed in any way as limiting the subject matter of the appended claims.

One embodiment relates to a system configured for aligning images of a specimen generated with different modes of an imaging subsystem. The system includes an imaging subsystem configured to generate first and second images of a specimen with first and second modes, respectively, of the imaging subsystem. The system also includes one or more computer systems configured for separately aligning the first and second images to a design for the specimen. For a location of interest in the first image, the one or more computer systems are also configured for generating a first difference image for the location of interest by subtracting a first reference image for the location of interest from a test image portion of the first image for the location of interest. The one or more computer systems are further configured for generating a second difference image for the location of interest by subtracting a second reference image for the location of interest from a test image portion of the second image for the location of interest. In addition, the one or more computer systems are configured for aligning the first and second difference images to each other and determining information for the location of interest from results of aligning the first and second difference images to each other. The system may be further configured as described herein.

Another embodiment relates to a method for aligning images of a specimen generated with different modes of an imaging subsystem. The method includes generating first and second images of a specimen with first and second modes, respectively, of an imaging subsystem. The method also includes the separately aligning, generating a first difference image, generating a second difference image, aligning, and determining information steps described above, which are performed by one or more computer systems. Each of the steps of the method described above may be further performed as described further herein. In addition, the embodiment of the method described above may include any other step(s) of any other method(s) described herein. Furthermore, the method described above may be performed by any of the systems described herein.

Another embodiment relates to a non-transitory computer-readable medium storing program instructions executable on a computer system for performing a computer-implemented method for aligning images of a specimen generated with different modes of an imaging subsystem. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
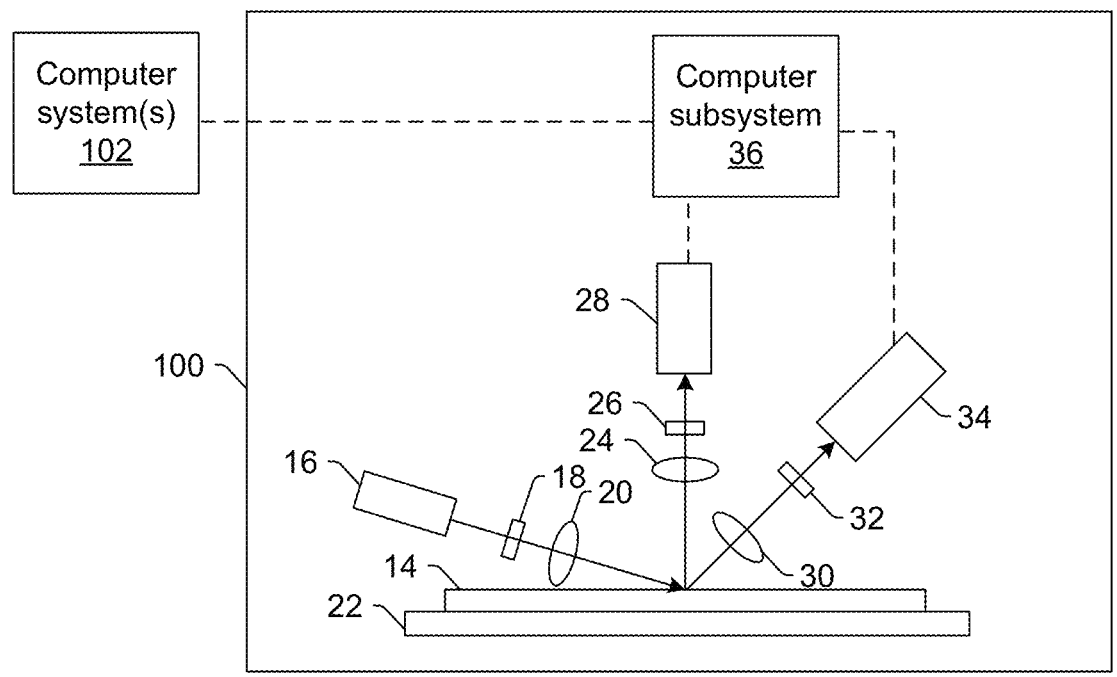
FIGS. 1 and 1*a* are schematic diagrams illustrating side views of embodiments of a system configured as described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The term "defects of interest (DOIs)" as used herein is defined as defects that are detected on a specimen and are really actual defects on the specimen. Therefore, the DOIs are of interest to a user because users generally care about how many and what kind of actual defects are on specimens being inspected. In some contexts, the term "DOI" is used to refer to a subset of all of the actual defects on the specimen, which includes only the actual defects that a user cares about. For example, there may be multiple types of actual defects on any given specimen, and one or more of them may be of greater interest to a user than one or more other types. In the context of the embodiments described herein, however, the term "DOIs" is used to refer to any and all real defects on a specimen.

The terms "design" and "design data" as used herein generally refer to the physical design (layout) of an IC and data derived from the physical design through complex simulation or simple geometric and Boolean operations. The physical design may be stored in a data structure such as a graphical data stream (GDS) file, any other standard machine-readable file, any other suitable file known in the art, and a design database. A GDSII file is one of a class of files used for the representation of design layout data. Other examples of such files include GL1 and OASIS files and proprietary file formats such as reticle design file (RDF) data, which is proprietary to KLA, Milpitas, Calif. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

The "design" and "design data" described herein also refers to information and data that is generated by semiconductor device designers in a design process and is therefore available for use in the embodiments described herein well in advance of printing of the design on any physical wafers. The "design" or "physical design" may also be the design as it would be ideally formed on the wafer. In this manner, a design may not include features of the design that would not be printed on the wafer such as optical proximity correction (OPC) features, which are added to the design to enhance printing of the features on the wafer without actually being printed themselves.

The terms "first" and "second" are used herein to merely indicate two things that are different from each other and are not used to indicate any temporal, spatial, preferential, or other characteristics of the elements referred to herein as "first" and "second."

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

In general, the embodiments described herein are configured for aligning images of a specimen generated with different modes of an imaging subsystem. In particular, the embodiments are configured for aligning images coming from multiple modes to each other. The embodiments described herein are particularly advantageous for image alignment for multi-mode imaging applications such as optical inspection.

In some embodiments, the specimen is a wafer. The wafer may include any wafer known in the semiconductor arts. Although some embodiments may be described herein with respect to a wafer or wafers, the embodiments are not limited in the specimens for which they can be used. For example, the embodiments described herein may be used for specimens such as reticles, flat panels, personal computer (PC) boards, and other semiconductor specimens.

One embodiment relates to a system configured for aligning images of a specimen generated with different modes of an imaging subsystem. One embodiment of such a system is shown in FIG. 1. The system includes imaging subsystem 100 configured to generate first and second images of a specimen with first and second modes, respectively, of the imaging subsystem. The imaging subsystem is coupled to one or more computer systems 102. In the embodiments shown in FIG. 1, the imaging subsystem is configured as a light-based imaging subsystem. In this manner, in some embodiments, the imaging subsystem is configured to generate the first and second images using light. However, in other embodiments described herein, the imaging subsystem is configured as an electron beam or charged particle beam imaging subsystem. In this manner, in other embodiments, the imaging subsystem is configured to generate the first and second images using electrons.

In general, the imaging subsystems described herein include at least an energy source, a detector, and a scanning subsystem. The energy source is configured to generate energy that is directed to a specimen by the imaging subsystem. The detector is configured to detect energy from the specimen and to generate output responsive to the detected energy. The scanning subsystem is configured to change a position on the specimen to which the energy is directed and from which the energy is detected.

In the light-based imaging subsystems described herein, the energy directed to the specimen includes light, and the energy detected from the specimen includes light. For example, in the embodiment of the system shown in FIG. 1, the imaging subsystem includes an illumination subsystem configured to direct light to specimen 14. The illumination subsystem includes at least one light source. For example, as shown in FIG. 1, the illumination subsystem includes light source 16. In one embodiment, the illumination subsystem is configured to direct the light to the specimen at one or more angles of incidence, which may include one or more oblique angles and/or one or more normal angles. For example, as shown in FIG. 1, light from light source 16 is directed through optical element 18 and then lens 20 to specimen 14 at an oblique angle of incidence. The oblique angle of incidence may include any suitable oblique angle of incidence, which may vary depending on, for instance, characteristics of the specimen and the process being performed on the specimen.

The illumination subsystem may be configured to direct the light to the specimen at different angles of incidence at different times. For example, the imaging subsystem may be configured to alter one or more characteristics of one or more elements of the illumination subsystem such that the light can be directed to the specimen at an angle of incidence that is different than that shown in FIG. 1. In one such example, the imaging subsystem may be configured to move light source 16, optical element 18, and lens 20 such that the light is directed to the specimen at a different oblique angle of incidence or a normal (or near normal) angle of incidence.

In some instances, the imaging subsystem may be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example in some instances, optical element 18 may be configured as a spectral filter and the properties of the spectral filter can be changed in a variety of different ways (e.g., by swapping out one spectral filter with another) such that different wavelengths of light can be directed to the specimen at different times. The illumination subsystem may have any other suitable configuration known in the art for directing the light having different or the same characteristics to the specimen at different or the same angles of incidence sequentially or simultaneously.

Light source 16 may include a broadband plasma (BBP) light source. In this manner, the light generated by the light source and directed to the specimen may include broadband light. However, the light source may include any other suitable light source such as a laser. The laser may include any suitable laser known in the art and may be configured to generate light at any suitable wavelength(s) known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused onto specimen 14 by lens 20. Although lens 20 is shown in FIG. 1 as a single refractive optical element, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used for imaging.

The imaging subsystem may also include a scanning subsystem configured to change the position on the specimen to which the light is directed and from which the light is detected and possibly to cause the light to be scanned over the specimen. For example, the imaging subsystem may include stage 22 on which specimen 14 is disposed during imaging. The scanning subsystem may include any suitable mechanical and/or robotic assembly (that includes stage 22) that can be configured to move the specimen such that the light can be directed to and detected from different positions on the specimen. In addition, or alternatively, the imaging subsystem may be configured such that one or more optical elements of the imaging subsystem perform some scanning of the light over the specimen such that the light can be directed to and detected from different positions on the specimen. In instances in which the light is scanned over the specimen, the light may be scanned over the specimen in any suitable fashion such as in a serpentine-like path or in a spiral path.

The imaging subsystem further includes one or more detection channels. At least one of the detection channel(s) includes a detector configured to detect light from the specimen due to illumination of the specimen by the system and to generate output responsive to the detected light. For example, the imaging subsystem shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, both detection channels are configured to detect scattered light, and the detection channels are configured to detect light that is scattered at different angles from the specimen. However, one or more of the detection channels may be configured to detect another type of light from the specimen (e.g., reflected light).

As further shown in FIG. 1, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 30, element 32, and detector 34 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 1 shows an embodiment of the imaging subsystem that includes two detection channels, the imaging subsystem may include a different number of detection channels (e.g., only one detection channel or two or more detection channels). In one such instance, the detection channel formed by collector 30, element 32, and detector 34 may form one side channel as described above, and the imaging subsystem may include an additional detection channel (not shown) formed as another side channel that is positioned on the opposite side of the plane of incidence. Therefore, the imaging subsystem may include the detection channel that includes collector 24, element 26, and detector 28 and that is centered in the plane of incidence and configured to collect and detect light at scattering angle(s) that are at or close to normal to the specimen surface. This detection channel may therefore be commonly referred to as a "top" channel, and the imaging subsystem may also include two or more side channels configured as described above. As such, the imaging subsystem may include at least three channels (i.e., one top channel and two side channels), and each of the at least three channels has its own collector, each of which is configured to collect light at different scattering angles than each of the other collectors.

As described further above, each of the detection channels included in the imaging subsystem may be configured to detect scattered light. Therefore, the imaging subsystem shown in FIG. 1 may be configured for dark field (DF) imaging of specimens. However, the imaging subsystem may also or alternatively include detection channel(s) that are configured for bright field (BF) imaging of specimens. In other words, the imaging subsystem may include at least one detection channel that is configured to detect light specularly reflected from the specimen. Therefore, the imaging subsystems described herein may be configured for only DF, only BF, or both DF and BF imaging. Although each of the collectors are shown in FIG. 1 as single refractive optical elements, each of the collectors may include one or more refractive optical elements and/or one or more reflective optical elements.

The one or more detection channels may include any suitable detectors known in the art such as photo-multiplier tubes (PMTs), charge coupled devices (CCDs), and time delay integration (TDI) cameras. The detectors may also include non-imaging detectors or imaging detectors. If the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the imaging subsystem may be signals or data, but not image signals or image data. In such instances, a computer subsystem such as computer subsystem 36 of the imaging subsystem may be configured to generate images of the specimen from the non-imaging output of the detectors. However, in other instances, the detectors may be configured as imaging detectors that are configured to generate imaging signals or image data. Therefore, the imaging subsystem may be configured to generate images in a number of ways.

It is noted that FIG. 1 is provided herein to generally illustrate a configuration of an imaging subsystem that may be included in the system embodiments described herein. Obviously, the imaging subsystem configuration described herein may be altered to optimize the performance of the imaging subsystem as is normally performed when designing a commercial imaging system. In addition, the systems described herein may be implemented using an existing system (e.g., by adding functionality described herein to an existing inspection system) such as the 29xx/39xx series of tools that are commercially available from KLA. For some such systems, the methods described herein may be provided as optional functionality of the system (e.g., in addition to other functionality of the system). Alternatively, the system described herein may be designed "from scratch" to provide a completely new system.

Computer subsystem 36 may be coupled to the detectors of the imaging subsystem in any suitable manner (e.g., via one or more transmission media, which may include "wired" and/or "wireless" transmission media) such that the computer subsystem can receive the output generated by the detectors. Computer subsystem 36 may be configured to perform a number of functions using the output of the detectors. For instance, if the system is configured as an inspection system, the computer subsystem may be configured to detect events (e.g., defects and potential defects) on the specimen using the output of the detectors. Detecting the events on the specimen may be performed as described further herein.

The computer subsystem of the imaging subsystem may be further configured as described herein. For example, computer subsystem 36 may be part of the one or more computer systems described herein or may be configured as the one or more computer systems described herein. In particular, computer subsystem 36 may be configured to perform the steps described herein. As such, the steps described herein may be performed "on-tool," by a computer system or subsystem that is part of an imaging subsystem.

The computer subsystem of the imaging subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems. For example, computer subsystem 36 may be coupled to computer system(s) 102 as shown by the dashed line in FIG. 1 by any suitable transmission media, which may include any suitable wired and/or wireless transmission media known in the art. Two or more of such computer subsystems may also be effectively coupled by a shared computer-readable storage medium (not shown).

Although the imaging subsystem is described above as being an optical or light-based imaging subsystem, in another embodiment, the imaging subsystem is configured as an electron beam imaging subsystem. In an electron beam imaging subsystem, the energy directed to the specimen includes electrons, and the energy detected from the specimen includes electrons. In one such embodiment shown in FIG. 1a, the imaging subsystem includes electron column 122, and the system includes computer subsystem 124 coupled to the imaging subsystem. Computer subsystem 124 may be configured as described above. In addition, such an imaging subsystem may be coupled to another one or more computer systems in the same manner described above and shown in FIG. 1.

Figure 1A:
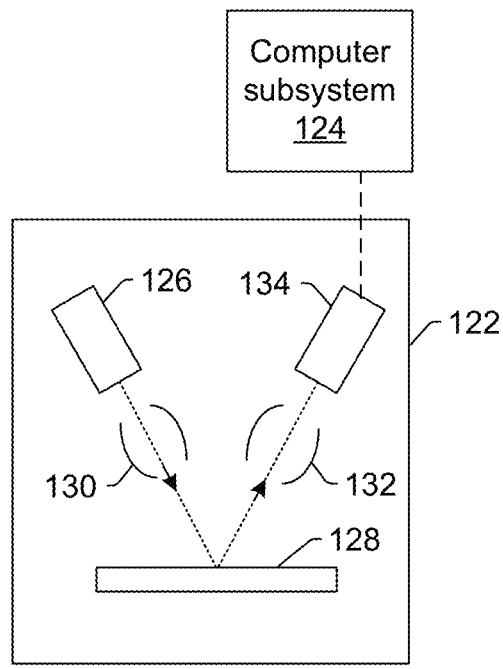

As also shown in FIG. 1a, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 1a as being configured such that the electrons are directed to the specimen at an oblique angle of incidence and are scattered from the specimen at another oblique angle, the electron beam may be directed to and scattered from the specimen at any suitable angles. In addition, the electron beam imaging subsystem may be configured to use multiple modes to generate output for the specimen as described further herein (e.g., with different illumination angles, collection angles, etc.). The multiple modes of the electron beam imaging subsystem may be different in any output generation parameters of the imaging subsystem.

Computer subsystem 124 may be coupled to detector 134 as described above. The detector may detect electrons returned from the surface of the specimen thereby forming electron beam images of (or other output for) the specimen. The electron beam images may include any suitable electron beam images. Computer subsystem 124 may be configured to detect events on the specimen using output generated by detector 134, which may be performed as described above or in any other suitable manner. Computer subsystem 124 may be configured to perform any additional step(s) described herein. A system that includes the imaging subsystem shown in FIG. 1a may be further configured as described herein.

It is noted that FIG. 1a is provided herein to generally illustrate a configuration of an electron beam imaging subsystem that may be included in the embodiments described herein. As with the optical imaging subsystem described above, the electron beam imaging subsystem configuration described herein may be altered to optimize the performance of the imaging subsystem as is normally performed when designing a commercial system. In addition, the systems described herein may be implemented using an existing system (e.g., by adding functionality described herein to an existing system) such as tools that are commercially available from KLA. For some such systems, the methods described herein may be provided as optional functionality of the system (e.g., in addition to other functionality of the system). Alternatively, the system described herein may be designed "from scratch" to provide a completely new system.

Although the imaging subsystem is described above as being a light or electron beam imaging subsystem, the imaging subsystem may be an ion beam imaging subsystem. Such an imaging subsystem may be configured as shown in FIG. 1a except that the electron beam source may be replaced with any suitable ion beam source known in the art.

In addition, the imaging subsystem may include any other suitable ion beam imaging system such as those included in commercially available focused ion beam (FIB) systems, helium ion microscopy (HIM) systems, and secondary ion mass spectroscopy (SIMS) systems.

As further noted above, the imaging subsystem is configured to have multiple modes. In general, a "mode" can be defined by the values of parameters of the imaging subsystem used to generate output for the specimen. Therefore, modes that are different may be different in the values for at least one of the optical or electron beam parameters of the imaging subsystem (other than position on the specimen at which the output is generated). For example, for a light-based imaging subsystem, different modes may use different wavelengths of light. The modes may be different in the wavelengths of light directed to the specimen as described further herein (e.g., by using different light sources, different spectral filters, etc. for different modes). In another embodiment, different modes may use different illumination channels. For example, as noted above, the imaging subsystem may include more than one illumination channel. As such, different illumination channels may be used for different modes.

The multiple modes may also be different in illumination and/or collection/detection. For example, as described further above, the imaging subsystem may include multiple detectors. Therefore, one of the detectors may be used for one mode and another of the detectors may be used for another mode. Furthermore, the modes may be different from each other in more than one way described herein (e.g., different modes may have one or more different illumination parameters and one or more different detection parameters). The imaging subsystem may be configured to scan the specimen with the different modes in the same scan or different scans, e.g., depending on the capability of using multiple modes to scan the specimen at the same time.

The output generated in the different modes may be aligned to each other as described further herein. For example, images generated in different modes may be aligned to each other so that images generated at the same location on the specimen can be used collectively for inspection. In other instances, the output generated for the same location in different modes may be aligned to each other so that results of any defect detection performed using the output generated in different modes may be aligned to each other. For example, the output generated with different modes may be aligned to each other so that the results of defect detection (e.g., defect candidates) detected with different modes are aligned to each other. In this manner, the results of the alignment can be easily used to determine which results have spatial coincidence with each other on the specimen across different modes.

In one embodiment, the imaging subsystem is an inspection subsystem. In this manner, the systems described herein may be configured as inspection systems. However, the systems described herein may be configured as another type of semiconductor-related quality control type system such as a defect review system and a metrology system. For example, the embodiments of the imaging subsystems described herein and shown in FIGS. 1 and 1a may be modified in one or more parameters to provide different imaging capability depending on the application for which they will be used. In one embodiment, the imaging subsystem is configured as an electron beam defect review subsystem. For example, the imaging subsystem shown in FIG. 1a may be configured to have a higher resolution if it is to be used for defect review or metrology rather than for inspection. In other words, the embodiments of the imaging subsystem shown in FIGS. 1 and 1a describe some general and various configurations for an imaging subsystem that can be tailored in a number of manners that will be obvious to one skilled in the art to produce imaging subsystems having different imaging capabilities that are more or less suitable for different applications.

As noted above, the imaging subsystem may be configured for directing energy (e.g., light, electrons) to and/or scanning energy over a physical version of the specimen thereby generating actual images for the physical version of the specimen. In this manner, the imaging subsystem may be configured as an "actual" imaging system, rather than a "virtual" system. However, a storage medium (not shown) and computer subsystem(s) 102 shown in FIG. 1 may be configured as a "virtual" system. In particular, the storage medium and the computer subsystem(s) are not part of imaging subsystem 100 and do not have any capability for handling the physical version of the specimen but may be configured as a virtual inspector that performs inspection-like functions, a virtual metrology system that performs metrology-like functions, a virtual defect review tool that performs defect review-like functions, etc. using stored detector output. Systems and methods configured as "virtual" systems are described in commonly assigned U.S. Pat. No. 8,126,255 issued on Feb. 28, 2012 to Bhaskar et al., U.S. Pat. No. 9,222,895 issued on Dec. 29, 2015 to Duffy et al., and U.S. Pat. No. 9,816,939 issued on Nov. 14, 2017 to Duffy et al., which are incorporated by reference as if fully set forth herein. The embodiments described herein may be further configured as described in these patents. For example, the one or more computer subsystems described herein may be further configured as described in these patents.

The system includes one or more computer systems, which may include any configuration of any of the computer subsystem(s) or system(s) described above. The one or more computer systems are configured for separately aligning the first and second images to a design for the specimen. In this manner, inter-mode image alignment may take advantage of align-to-design algorithms such as those available from KLA and described in the above-reference patent by Kulkarni to align images of multiple modes to the design coordinate system. Aligning the first and second images to the design may also be performed as described in U.S. Pat. No. 9,830,421 to Bhattacharyya et al. issued Nov. 27, 2017 and U.S. Pat. No. 10,698,325 to Brauer issued Jun. 30, 2020, which are incorporated by reference as if fully set forth herein. The embodiments described herein may be further configured as described in these patents. This step may also be performed as described further herein.

Figure 2A:
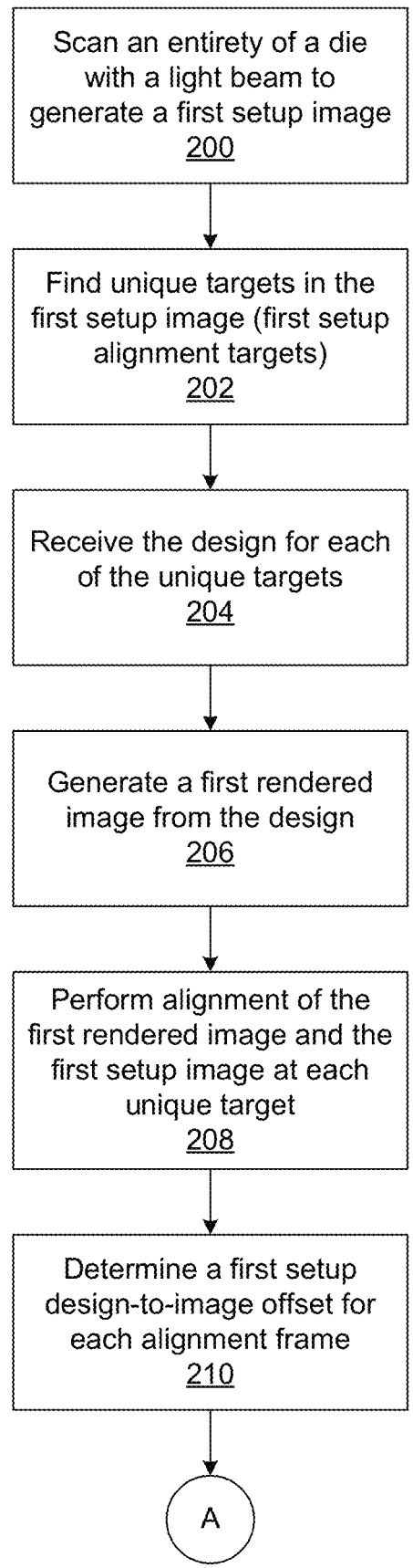
FIG. 2*a*-2*c* are flow charts illustrating embodiments of steps that may be performed for aligning images of a specimen generated with different modes of an imaging subsystem.

In one embodiment, the imaging subsystem is configured to generate a first setup image for the specimen with the first mode, and the one or more computer systems are configured for selecting a first setup alignment target in the first setup image, generating a first rendered image from the design for the first setup alignment target, aligning the first rendered image to a portion of the first setup image corresponding to the first setup alignment target, and determining a first setup design-to-image offset for the first setup alignment target. For example, as shown in step 200 of FIG. 2a, the imaging subsystem may scan an entirety of a die with a light beam (or another energy source described herein) to generate a first setup image. Generating the first setup image may include scanning an entirety of a die or any other suitable repeating structure on the specimen such as a field. The scanning may be performed as described further herein.

The one or more computer systems may then find unique targets in the first setup image (first setup alignment targets), as shown in step 202. The unique targets may be unique in any suitable manner known in the art that renders the targets suitable for alignment purposes. For example, the unique targets may be a patterned feature that has a unique shape compared to other patterned features within a predetermined search window such as an image frame or job, patterned features that have a unique spatial relationship with respect to each other within the predetermined search window, etc. Although it may be practical to select multiple unique targets in the first setup image, in general, any one or more unique targets may be selected in the first setup image. Each of the unique targets may be different from each other in any unique way. In addition, the unique targets may include more than one instance of the same unique target.

As shown in step 204, the one or more computer systems may receive the design for each of the unique target(s). The one or more computer systems may receive the design in any suitable manner such as by searching a design for the specimen based on information for the unique target(s) gathered from the first setup image, by requesting a portion of a design (e.g., a design clip) at the position(s) of the unique target(s) from a storage medium or computer system that contains the design, etc. The design that is received by the one or more computer systems may include any of the design, design data, or design information described further herein.

As shown in step 206, the one or more computer systems may generate a first rendered image from the design. Generating the first rendered image may be performed in any suitable manner. For example, based on design clips of the unique target(s) from design data for one or more layers on the specimen, the design layer(s) can be rendered and the resulting simulated images may be used as described further herein. The embodiments described herein may also use rendered images of possible alignment target(s) and compare those to first setup image alignment target location images to pick the best subset of the unique target(s) for use as described further herein.

Generating the first rendered image may be performed by one or more components such as a model, software, hardware, and the like executed by the one or more computer system(s). In some instances, the one or more components may perform a forward type simulation of the processes involved in fabricating the design layer(s) on the specimen. For example, simulating the images may include simulating what the design layer(s) would look like when printed on a specimen. In other words, rendering or simulating the images may include generating a simulated representation of a specimen on which the design layer(s) are printed. One example of an empirically trained process model that may be used to generate a simulated specimen includes SEMulator 3D, which is commercially available from Coventor, Inc., Cary, N.C. An example of a rigorous lithography simulation model is Prolith, which is commercially available from KLA, and which can be used in concert with the SEMulator 3D product. However, the simulated specimen may be generated using any suitable model(s) of any of the process(es) involved in producing actual specimens from the design. In this manner, the design may be used to simulate what a specimen on which the corresponding design layer(s) have been formed will look like in specimen space (not necessarily what such a specimen would look like to an imaging system). Therefore, the simulated representation of the specimen may represent what the specimen would look like in 2D or 3D space of the specimen.

The simulated representation of the specimen may then be used to generate the rendered image(s) that illustrate how the unique target(s) would appear in the first mode images of the specimen. These rendered images may be produced using a model such as WINsim, which is commercially available from KLA, and which can rigorously model the response of an inspector using an electromagnetic (EM) wave solver. Such simulations may be performed using any other suitable software, algorithm(s), method(s), or system(s) known in the art.

In other instances, the one or more components may include a deep learning (DL) type model that is configured for inferring the rendered image(s) from the design. In other words, the one or more components may be configured to transform (by inference) one or more design files into one or more rendered images that would be generated for the specimen with the first mode. The one or more components may include any suitable DL model or network known in the art, including for example, a neural network, a CNN, a generative model, etc. The one or more components may also be configured as described in commonly owned U.S. Patent Application Publication Nos. 2017/0140524 published May 18, 2017 by Karsenti et al., 2017/0148226 published May 25, 2017 by Zhang et al., 2017/0193400 published Jul. 6, 2017 by Bhaskar et al., 2017/0193680 published Jul. 6, 2017 by Zhang et al., 2017/0194126 published Jul. 6, 2017 by Bhaskar et al., 2017/0200260 published Jul. 13, 2017 by Bhaskar et al., 2017/0200264 published Jul. 13, 2017 by Park et al., 2017/0200265 published Jul. 13, 2017 by Bhaskar et al., 2017/0345140 published Nov. 30, 2017 by Zhang et al., 2017/0351952 published Dec. 7, 2017 by Zhang et al., 2018/0107928 published Apr. 19, 2018 by Zhang et al., 2018/0293721 published Oct. 11, 2018 by Gupta et al., 2018/0330511 published Nov. 15, 2018 by Ha et al., 2019/0005629 published Jan. 3, 2019 by Dandiana et al., and 2019/0073568 published Mar. 7, 2019 by He et al., which are incorporated by reference as if fully set forth herein. The embodiments described herein may be further configured as described in these patent application publications. In addition, the embodiments described herein may be configured to perform any steps described in these patent application publications.

As shown in step 208, the one or more computer systems may perform alignment of the first rendered image and the first setup image at each unique target. The alignment of the first rendered image and the first setup image may be performed as described further herein or in any other suitable manner known in the art. As shown in step 210, the one or more computer systems may determine a first setup design-to-image offset for each alignment frame (i.e., each image frame containing an instance of an alignment target). The first setup design-to-image offset may be determined in any suitable manner and may be expressed in any suitable manner (e.g., as a Cartesian offset, as a two-dimensional function, etc.).

Based on results of the alignment of the first rendered image and the first setup image, the one or more computer systems may determine the suitability of the first setup alignment targets for use in the embodiments described herein. For example, if it is impossible to align one of the setup alignment targets to the first rendered image for that setup alignment target, that setup alignment target may be rejected. In this manner, multiple first setup alignment targets may be selected and considered by the embodiments described herein, and only a portion of the alignment targets may be selected for use as described further herein. In addition, more than one setup alignment target may be selected for use in the embodiments described herein, and one or more setup alignment targets may be selected in each test image portion of the first image that will be aligned to design as described herein. For example, the embodiments described herein may try to select at least one alignment target per frame image in the first image.

The above procedure may be performed by the system for all (or two or more) modes, and the one or more computer systems may generate a database with alignment frame images and their offsets for each mode. For example, in one such embodiment, the imaging subsystem is configured to generate a second setup image for the specimen with the second mode, and the one or more computer systems are configured for selecting a second setup alignment target in the second setup image, generating a second rendered image from the design for the second setup alignment target, aligning the second rendered image to a portion of the second setup image corresponding to the second setup alignment target, and determining a second setup design-to-image offset for the second setup alignment target. Each of these steps may be performed as described further above. In this manner, the embodiments described herein may be configured for aligning images of different modes to each other using a patch-to-design approach.

For a location of interest in the first image, the one or more computer systems are configured for generating a first difference image for the location of interest by subtracting a first reference image for the location of interest from a test image portion of the first image for the location of interest. The first reference image may be subtracted from the test image portion of the first image in any suitable manner. The first reference image may include any suitable reference image such as an image generated by the imaging subsystem at a location on the specimen corresponding to the location of interest (i.e., an image from an adjacent die on the specimen), a reference image from a database or another storage medium, a reference image rendered from a design and stored in a storage medium, and the like.

Before the first reference image is subtracted from the test image portion of the first image, the first reference image and the test image portion may be aligned to each other or to a common reference. For example, in one embodiment, the first reference image and the test image portion of the first image are aligned to each other prior to generating the first difference image based on results of separately aligning the first image to the design. In one such example, a reference image generated from the specimen may be aligned to a design for the specimen as described herein. Therefore, when the first image is aligned to the design as described herein, the first reference image and the test portion of the first image are aligned to a common reference (the design) and are therefore effectively aligned to each other based on the design coordinates. In another such example, the reference image may be a portion of the design or may be rendered from the design and therefore inherently aligned to the design. In this manner, the first reference image and the test portion of the first image may also be aligned to a common reference (the design) via the separately aligning the first image to the design. In a further example, the first reference image and the test portion of the first image may be directly aligned to each other, which may be performed as described herein, and then subtracted from each other.

In one embodiment, the location of interest is a location of a defect detected in the first image, and the imaging subsystem is configured as an inspection subsystem. For example, if the imaging subsystem is an inspection subsystem, and if the alignment described herein is being performed for inspection of a specimen, then first difference images may be generated as described herein for a plurality of locations of interest on the specimen (e.g., the inspected area on the specimen) and then defect detection may be performed using the first difference images. The defect detection may be performed as described further herein. Therefore, the first difference images may be generated prior to knowing the location of interest for which the steps described herein are performed. The location of interest for which the steps described herein are performed may therefore be one of the locations at which a defect is detected using the first difference images. In this manner, the first difference images may be generated prior to identification of the location of interest for which the steps described herein are performed. In addition, the steps described herein may be performed for multiple locations of interest, and a defect may be detected at each of the multiple locations of interest. In other instances, however, such as metrology and defect review, the location of interest may be known in advance to (e.g., from a metrology or defect review sampling plan) prior to generating the first difference image. In this manner, the first difference image may be generated for a location of interest known a priori. As described further herein, for some applications like inspection, the additional steps described herein may be performed for only some of the locations for which first difference images were generated (e.g., for only locations of defects detected on the specimen).

In another embodiment, the one or more computer systems are configured for determining a care area in the test image portion of the first image based on the first runtime design-to-image offset, performing defect detection in the care area, and designating a location of a defect detected by the defect detection as the location of interest. For example, the one or more computer systems may determine the care area placement in the test image portion of the first image by performing an align to design for the first runtime image.

Figure 2B:
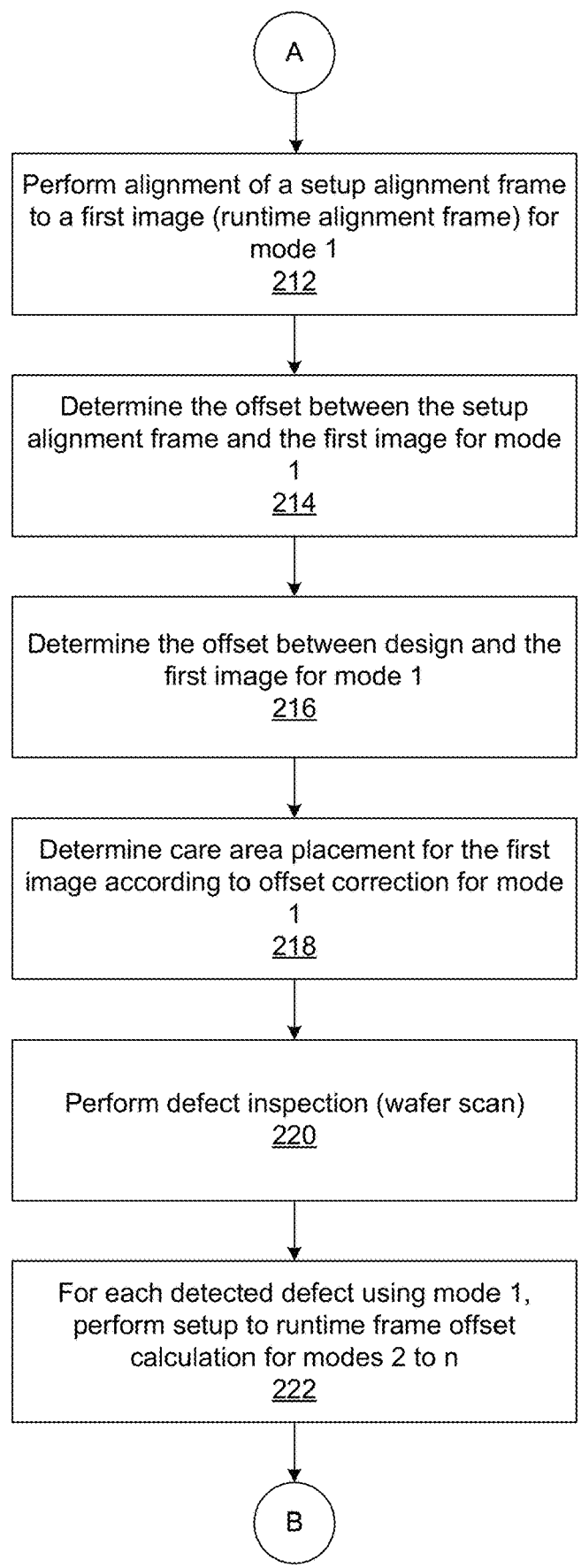

In one such example, the one or more computer systems may be configured to perform alignment of a setup alignment frame to a first image (runtime alignment frame) for mode 1, as shown in step 212 of FIG. 2b. The setup alignment frame may be a frame image from the first setup image at the position of one of the first setup alignment targets. This alignment may be performed as described herein or in any other suitable manner known in the art. The one or more computer systems may also determine the offset between the setup alignment frame and the first image for mode 1, as shown in step 214. In addition, the one or more computer systems may determine the offset between design and the first image for mode 1, as shown in step 216. These offsets may be determined in any suitable manner known in the art and may have any format known in the art.

As shown in step 218, the one or more computer systems may determine a care area for the first image according to offset correction for mode 1. Determining the care area for the first image may include using the location of the care area in the design, which should be known a priori from another method or system, and the offset between the design and the first image for mode 1 to place the care area in the first image. In other words, if the position of the care area is known in the design coordinates and the first image has been aligned to the design as described above, then the location of the care area in the first image can be easily determined. The care area may be any suitable care area known in the art, may be generated in any suitable manner known in the art, and may have any suitable format known in the art. For example, the care area may be one of multiple care areas determined from the design and may encompass areas of interest to a user.

The one or more computer systems may then perform a defect inspection (wafer scan), as shown in step 220. The defect inspection may be performed in any suitable manner such as by applying a threshold to the difference image. Locations or areas in the difference image that are greater than the threshold may be identified as defects (or potential defects), and locations or areas in the difference image that are less than the threshold may not be identified as potential defects or defects. The defect inspection may also be performed using any suitable defect detection method or algorithm known in the art such as the MDAT defect detection algorithm that is used by some inspection tools commercially available from KLA. The location of the defects may then be determined in any suitable manner known in the art (e.g., using the location of the defects in the difference or test images, the location of the defects can be determined with respect to the specimen or the design based on the images themselves or the offsets described herein). A location of one of the defects or potential defects may then be designated as a location of interest for the steps described herein.

The one or more computer systems are further configured for generating a second difference image for the location of interest by subtracting a second reference image for the location of interest from a test image portion of the second image for the location of interest. The second difference image may be generated as described further above just with different test and reference images. The reference image used for generating the second difference image may be any of the reference images described above but generated for the second mode rather than the first mode. In other words, different reference images may be used for generating difference images for different modes (regardless of whether the difference images are generated in the same or different ways).

In one embodiment, separately aligning the second image to the design is performed for only a portion of the second image corresponding to the location of the defect detected by the defect detection. For example, as shown in step 222, for each detected defect using mode 1, the one or more computer systems may perform setup to runtime frame offset calculations for modes 2 to n. In this manner, the defects may be detected in a first mode, and locations of defects may be designated as locations of interest as described above. Then for any one location of a defect, the second image may be aligned to the design, which may be performed as described herein, for only the portion of the second image corresponding to the location of that defect. Again, although the separately aligning is described herein as being performed for a location of interest, the separately aligning for images generated with the second mode may be performed for any one or more locations of interest.

In another embodiment, the one or more computer systems are configured for performing said separately aligning for the first image, determining the location of interest in the first image, and performing the separately aligning for the second image based on the determined location of interest. For example, determining the location of interest in the first image may be performed by aligning the first image to design as described herein and then performing defect detection using the first image. Aligning the second image to the design may then be performed for only a location or locations of interest corresponding to defect(s) detected as described above. The location(s) of interest may also not correspond to defects. For example, in such embodiments, the location(s) of interest may also be locations at which metrology is performed, locations at which metrology performed using the first images produced an abnormal result, locations at which a defect was redetected during defect review, and the like. In this manner, the first images generated with the first mode may be aligned to design, one or more locations of interest may be determined in the first images based on results of that aligning step, and then for any one or more of the locations of interest, the second images generated with the second mode may be aligned to design. Aligning the second image(s) to the design for the location(s) of interest may be performed for a number of reasons described herein, e.g., generating difference images for the location(s) of interest, but also for determining information for the location(s), a defect detected at the location(s), a patterned feature measured as the location(s), and the like.

Figure 2C:
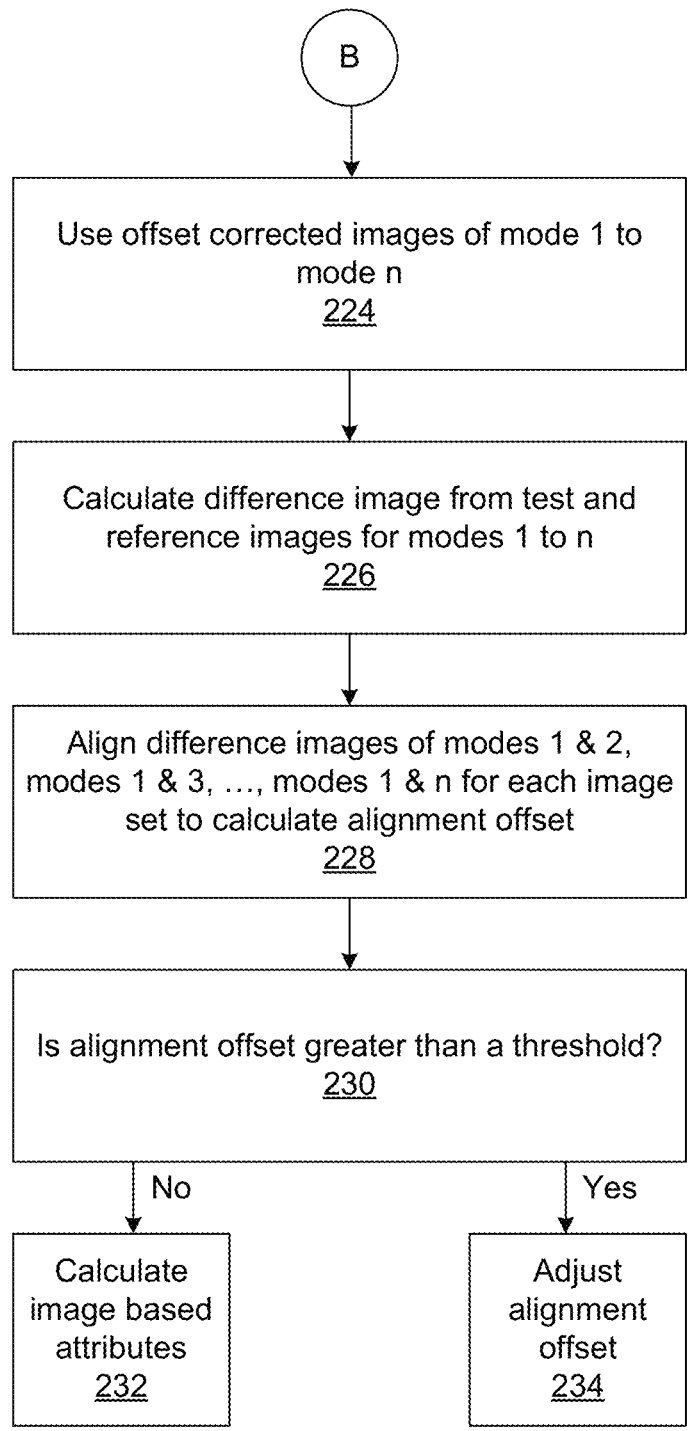

The one or more computer systems are also configured for aligning the first and second difference images to each other. For example, as shown in step 224 of FIG. 2c, the one or more computer systems may use offset corrected images of mode 1 to mode n. The offset corrected images for each of the modes may be generated as described herein. The one or more computer systems may also calculate the difference image from test and reference images for modes 1 to n, as shown in step 226 of FIG. 2c. As shown in step 228 of FIG. 2c, the one or more computer systems may also align difference images of modes 1 and 2, modes 1 and 3, . . . , modes 1 and n for each image set to calculate alignment offset. In this manner, the embodiments described herein may be configured for using the difference images generated from two different modes and aligning them to each other. Aligning the difference images to each other may be performed as described further herein and provides a number of advantages as described further herein.

Figure 3:
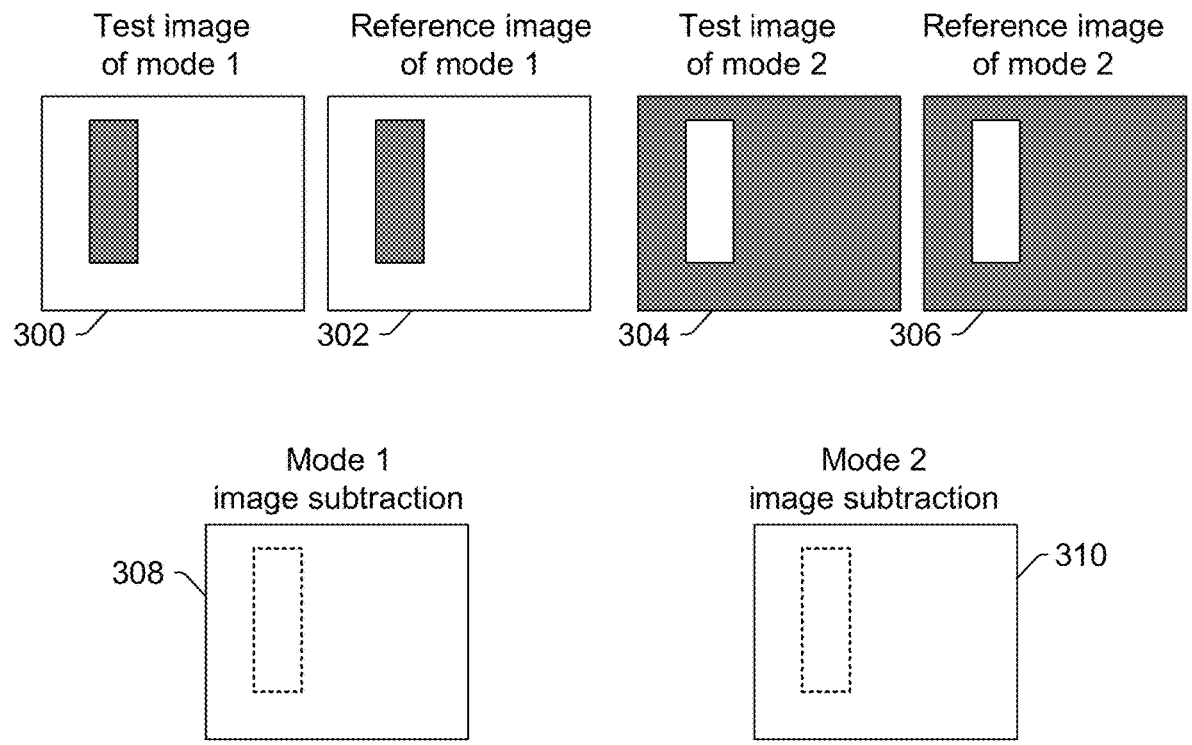
FIG. 3 is a schematic diagram illustrating differences between images of a specimen generated with different modes of an imaging subsystem and difference images generated for the different modes.

In one embodiment, aligning the first and second difference images to each other includes aligning noise in the first difference image to noise in the second difference image. For example, original images generated with different modes may be difficult to align to each other since some structures might not exist in each of the multi-mode images, some might be inverted in their contrast, or have different grey levels. In one such example, as shown in FIG. 3, test image of mode 1 (300) and reference image of mode 1 (302) appear substantially different than test image of mode 2 (304) and reference image of mode 2 (306). In particular, the test and reference images generated with mode 1 and test and reference images generated with mode 2 shown in FIG. 3 may be generated for the same location on a specimen but, as can be seen from FIG. 3, have inverted grey levels. In particular, the areas in the test and reference images of mode 1 that have relatively dark grey levels have relatively bright grey levels in the test and reference images of mode 2. The same is true for the relatively bright grey levels in the test and reference images of mode 1 and the relatively dark grey levels in the test and reference images of mode 2.

However, when difference images are generated for multiple modes, the process of generating the difference images for different modes can actually reduce or even eliminate many or even all of the differences between the mode images that make inter-mode image alignment difficult. For example, difference image 308 may be generated from test image 300 and reference image 302 by mode 1 image subtraction, which may be performed as described herein. In addition, difference image 310 may be generated from test image 304 and reference image 306 by mode 2 image subtraction, which may be performed as described herein.

As can be seen from difference images 308 and 310, the inverted grey levels at corresponding locations in the test and reference images for modes 1 and 2 have been eliminated from the difference images by the image subtraction. The remaining noise in the difference images, illustrated in these images by the dotted lines, can then be used for image alignment. In particular, the remaining noise in the two difference images can be used for aligning an image from the first mode to an image from the second mode. As such, difference images can be used to align images of different modes. In addition, difference image noise can be used for image alignment. The difference image noise can be used for image alignment as described herein or in any other suitable manner. For example, the difference image noise may be treated like any other image feature in an image alignment process.

In some embodiments, aligning the first and second difference images to each other is performed based on a normalized sum of squared differences (NSSD). For example, step 228 of FIG. 2c may be performed using NSSD of difference images of modes 1 and 2, modes 1 and 3, . . . , modes 1 and n for each image set to calculate alignment offset. NSSD may be performed using any suitable method, algorithm, function, etc. known in the art.

The one or more computer systems are further configured for determining information for the location of interest from results of aligning the first and second difference images to each other. For example, there is a variety of information that can be determined from the difference image alignment results. As described further herein, such information includes information about how well the mode images have been aligned to a design and therefore a common reference, information for the location of interest determined from multiple difference images or other images whose alignment has been verified and/or corrected by the difference image alignment, information about the modes themselves that can be used for mode selection and recipe setup, and the like.

In one embodiment, determining the information includes verifying if the separately aligning is performed accurately. For example, the performance of the inter-mode alignment may be verified using the difference images of each mode. In this manner, the embodiments described herein can be configured for using difference images to validate design based alignment. In particular, as described further herein, the mode images are aligned to a design prior to generating the difference images. Therefore, when the difference images from different modes are aligned to each other, if the design-to-image processes were successful, there should not be any alignment offset between the design coordinates of the difference images. In other words, after the difference images are aligned to each other, the aligned positions in the difference images should have the same design coordinates. If aligned positions in the difference images do not have the same design (or other common reference) coordinates, then there is some marginality in one or more of the design-to-image alignment processes for one or more of the modes.

In practice, of course, the offset between aligned positions in the difference images does not need to be exactly zero to verify the separately aligning as accurate. Instead, there may be some acceptable tolerance in the alignment offset between the difference images that can be taken into consideration when determining the verification. Such acceptable tolerance can be quantified by the threshold described further herein.

In some embodiments, the verifying includes determining an alignment offset between the first and second difference images and comparing the alignment offset to a predetermined threshold. For example, as shown in step 230, the one or more computer systems may determine if the alignment offset is greater than a threshold. This alignment offset may be determined as described further herein. The predetermined threshold may be determined based on the acceptable values of the alignment offset. Therefore, the predetermined threshold may be responsive to the acceptable marginality in the individual mode-specific, design-to-image alignment processes. As such, the predetermined threshold may vary depending on factors such as the type of specimen, the application for which the alignment is being performed, the user-required performance of the alignment process, and the like. One example of a suitable threshold may be greater than or equal to one pixel in either one or two dimensions. The threshold may have any suitable format known in the art which may vary depending on the format of the alignment offset. For example, the threshold may be expressed as a function, in one or two dimensions, etc.

In another embodiment, when the separately aligning is verified as performed accurately, determining the information includes determining one or more attributes of a defect at the location of interest from the first and second difference images. For example, as shown in step 232 of FIG. 2c, if the alignment offset is not greater than a threshold, the one or more computer systems may calculate image-based attributes. In this manner, the embodiments described herein enable defect attributes to be determined from multi-mode images that are aligned to each other within some predetermined accuracy. In other words, the embodiments described herein can essentially ensure that the defect attributes determined from images generated with different modes are determined at the actual location of the defect in multi-mode images. The defect attributes that are determined from the multi-mode images may include any defect attributes known in the art such as defect size, defect shape, defect roughness, defect orientation, and the like. In addition, the defect attributes that are determined from different multi-mode images may be the same defect attributes or different defect attributes. For example, defect size may be separately determined from each of two or more multi-mode images. In another example, defect size may be determined from one of two or more multi-mode images, and defect roughness may be determined from another of the two or more multi-mode images. Whether the same or different defect attributes are determined from multi-mode images, the multiple defect attributes may be used in combination for one or more applications such as defect classification, defect verification, defect filtering, etc.

For applications other than inspection, information about the location of interest may be determined separately from the different mode images and used collectively or separately. For instance, for an application like metrology, when the location of interest is successfully located in multi-mode images, an attribute or characteristic of the location of interest may be determined from each of two or more of the multi-mode images. For example, one of the mode images may be used to determine a dimension of a patterned feature or layer at the location of interest, and another of the mode images may be used to determine a roughness of the patterned feature or layer.

In an additional embodiment, when the separately aligning is not verified as performed accurately, determining the information includes determining one or more corrections to at least one of the separately aligning the first and second images to the design and aligning the first and second difference images to each other. For example, if the alignment offset between the difference images is too big (e.g., greater than the predetermined threshold) then it can be corrected using the offset derived from the difference image alignment. In one such example, as shown in step 234 of FIG. 2*c*, if the alignment offset is greater than a threshold, then the one or more computer systems may adjust the alignment offset. In this manner, the embodiments described herein may be configured for using difference images to correct design based alignment. Correcting the design based alignment may otherwise be performed in any suitable manner known in the art.

In this manner, the embodiments described herein can align two (or more) images originating from different modes to each other. For example, as described above, separately aligning the images of different modes to a design should in theory result in images from multiple modes aligned to a common reference and therefore to each other. However, such alignment does not always succeed, particularly with sufficient accuracy required by present day applications such as inspection, metrology, and review. The inaccuracies can arise from such difficult to eliminate sources such as marginalities in the image rendering from design, difficulties in selecting unique alignment target(s) from the mode images, marginalities in the align-to-design algorithm, etc. However, by aligning difference images generated from multiple modes to each other, the embodiments described herein can perform a direct difference image-to-difference image alignment that as described above can be used to determine if the alignment to design performed separately for different modes is verified, if the alignment is not within acceptable accuracy requirements (as determined by the comparison to the predetermined threshold), and if the alignment is not verified as sufficiently accurate, to make one or more corrections to the alignment results (e.g., one or more of the alignment offsets) to thereby correct the alignment accuracy.

The one or more computer systems may be configured to use the results of the defect detection step, the determining information step, and any other step described herein to perform one or more functions for the specimen, the imaging subsystem, or another specimen, process, or tool. For example, results produced by the one or more computer systems described herein may include information for any defects detected on the specimen such as location, etc., of the bounding boxes of the detected defects, detection scores, information about defect classifications such as class labels or IDs, any defect attributes determined from any of the multiple modes, multi-mode defect images, etc., or any such suitable information known in the art.

The results for the defects and/or locations of interest may be generated by the computer system(s) and/or imaging subsystem in any suitable manner. The results for the defects and/or locations of interest may have any suitable form or format such as a standard file type. The computer system(s) and/or imaging subsystem may generate the results and store the results such that the results can be used by the computer system(s) and/or another system or method to perform one or more functions for the specimen or another specimen of the same type. Such functions include, but are not limited to, altering a process such as a fabrication process or step that was performed on the specimens in a feedback manner, altering a process such as a fabrication process or step that will be performed on the specimens in a feedforward manner, etc. For example, the embodiments described herein can allow inspection processes and tools to detect certain DOIs with increased sensitivity due to the relatively high accuracy inter-mode image alignment enabled by the embodiments described herein. This increased sensitivity to certain DOIs allows users to improve their ability to make correct processing decisions.

The computer system(s) may also be configured for storing the determined information in any suitable computer-readable storage medium. The information may be stored with any of the results described herein and may be stored in any manner known in the art. The storage medium may include any storage medium described herein or any other suitable storage medium known in the art. After the information has been stored, the information can be accessed in the storage medium and used by any of the method or system embodiments described herein, formatted for display to a user, used by another software module, method, or system, etc. For example, the embodiments described herein may generate an inspection recipe as described further herein. That inspection recipe may then be stored and used by the system or method (or another system or method) to inspect the specimen or other specimens to thereby generate information (e.g., defect information) for the specimen or other specimens.

The embodiments described herein can also be used for setting up an image-based process like inspection, defect review, metrology, etc. For example, although the embodiments are described herein for applications in which the modes have been previously selected and are known, in some instances, the embodiments described herein can be used to align images from different modes to each other so that the usefulness of the images and therefore the modes for a particular application can be evaluated. In one such example, the images from different modes may be aligned to each other as described herein, and then each of the images can be evaluated for how useful they are for performing a process like inspection, defect review, metrology, etc. For example, whether or not a particular feature or defect can be detected in each of the images from different modes that have been aligned to each other may be used to determine whether each of the different modes can be used for defect detection or patterned feature measurements. In addition, images from different modes that have been aligned to each other can be evaluated to determine which defect attributes or patterned feature characteristics can be determined from them at a location of interest. In this manner, modes that are useful and/or complementary to each other may be identified based on inter-mode image alignment. As described above, mode selection is an often cumbersome and difficult process. Having the ability to substantially accurately align images from different modes provided by the embodiments described herein provides significant advantages for that process like reduced time to results, increased robustness, better performance of the resulting multi-mode process, etc.

The embodiments described herein may perform mode selection as described in U.S. Pat. No. 10,115,040 to Brauer issued on Oct. 30, 2018, U.S. Patent Application Publication No. 2020/0193588 by Brauer et al. published Jun. 18, 2020, and U.S. patent application Ser. No. 16/883,794 by Gaind et al. filed May 26, 2020, which are incorporated by reference as if fully set forth herein. The embodiments described herein may be further configured as described in these references.

Each of the embodiments of the system described above may be combined together into one single embodiment. In other words, unless otherwise noted herein, none of the system embodiments are mutually exclusive of any other system embodiments.

Another embodiment relates to a method for aligning images of a specimen generated with different modes of an imaging subsystem. The method includes generating first and second images of a specimen with first and second modes, respectively, of an imaging subsystem. The method also includes separately aligning the first and second images to a design, generating a first difference image, generating a second difference image, aligning the first and second difference images to each other, and determining information steps described above. The steps are performed by one or more computer systems, which may be configured according to any of the embodiments described herein.

Each of the steps of the method may be performed as described further herein. The method may also include any other step(s) that can be performed by the imaging subsystem and/or computer system(s) described herein. In addition, the method described above may be performed by any of the system embodiments described herein.

Figure 4:
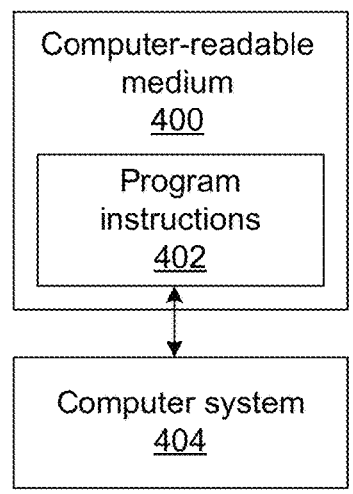
FIG. 4 is a block diagram illustrating one embodiment of a non-transitory computer-readable medium storing program instructions for causing a computer system to perform a computer-implemented method described herein.

An additional embodiment relates to a non-transitory computer-readable medium storing program instructions executable on a computer system for performing a computer-implemented method for aligning images of a specimen generated with different modes of an imaging subsystem. One such embodiment is shown in FIG. 4. In particular, as shown in FIG. 4, non-transitory computer-readable medium 400 includes program instructions 402 executable on computer system 404. The computer-implemented method may include any step(s) of any method(s) described herein.

Program instructions 402 implementing methods such as those described herein may be stored on computer-readable medium 400. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 404 may be configured according to any of the embodiments described herein.

Further modifications and alternative embodiments of various aspects of the invention will be apparent to those skilled in the art in view of this description. For example, methods and systems for aligning images of a specimen generated with different modes of an imaging subsystem are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain attributes of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured for aligning images of a specimen generated with different modes of an imaging subsystem, comprising:
   the imaging subsystem configured to generate a first image and a second image of the specimen with first and second modes, respectively, of the imaging subsystem; and
   one or more computer systems configured for:
      separately aligning the first image and the second image to a design for the specimen;
      for a location of interest in the first image, generating a first difference image for the location of interest by subtracting a first reference image for the location of interest from a test image portion of the first image for the location of interest;
      generating a second difference image for the location of interest by subtracting a second reference image for the location of interest from a test image portion of the second image for the location of interest;
      aligning the first and second difference images to each other; and
      determining information for the location of interest from results of said aligning the first and second difference images to each other, wherein determining the information comprises verifying if the separately aligning is performed accurately.

2. The system of claim 1, wherein aligning the first and second difference images to each other comprises aligning noise in the first difference image to noise in the second difference image.

3. The system of claim 1, wherein aligning the first and second difference images to each other is performed based on a normalized sum of squared differences.

4. The system of claim 1, wherein said verifying comprises determining an alignment offset between the first and second difference images and comparing the alignment offset to a predetermined threshold.

5. The system of claim 1, wherein, when the separately aligning is verified as performed accurately, determining the information further comprises determining one or more attributes of a defect at the location of interest from the first and second difference images.

6. The system of claim 1, wherein, when the separately aligning is not verified as performed accurately, determining the information further comprises determining one or more corrections to at least one of the separately aligning the first image and the second image to the design and the aligning the first and second difference images to each other.

7. The system of claim 1, wherein the location of interest is a location of a defect detected in the first image, and wherein the imaging subsystem is further configured as an inspection subsystem.

8. The system of claim 1, wherein the imaging subsystem is further configured to generate a first setup image for the specimen with the first mode, and wherein the one or more computer systems are further configured for selecting a first setup alignment target in the first setup image, generating a first rendered image from the design for the first setup alignment target, aligning the first rendered image to a portion of the first setup image corresponding to the first setup alignment target, and determining a first setup design-to-image offset for the first setup alignment target.

9. The system of claim 8, wherein the imaging subsystem is further configured to generate a second setup image for the specimen with the second mode, and wherein the one or more computer systems are further configured for selecting a second setup alignment target in the second setup image, generating a second rendered image from the design for the second setup alignment target, aligning the second rendered image to a portion of the second setup image corresponding to the second setup alignment target, and determining a second setup design-to-image offset for the second setup alignment target.

10. The system of claim 8, wherein said separately aligning comprises aligning a setup alignment frame image in the first setup image for the first setup alignment target to a corresponding frame image in the first image, determining a first image-to-image offset between the setup alignment frame image and the corresponding frame image, and determining a first runtime design-to-image offset between the corresponding frame image and the design based on the first image-to-image offset and the first setup design-to-image offset.

11. The system of claim 10, wherein the one or more computer systems are further configured for determining a care area in the test image portion of the first image based on the first runtime design-to-image offset, performing defect detection in the care area, and designating a location of a defect detected by the defect detection as the location of interest.

12. The system of claim 11, wherein said separately aligning the second image to the design is performed for only a portion of the second image corresponding to the location of the defect detected by the defect detection.

13. The system of claim 1, wherein the one or more computer systems are further configured for performing said separately aligning for the first image, determining the location of interest in the first image, and performing said separately aligning for the second image based on the determined location of interest.

14. The system of claim 1, wherein the first reference image and the test image portion of the first image are aligned to each other prior to generating the first difference image based on results of said separately aligning the first image to the design.

15. The system of claim 1, wherein the specimen is a wafer.

16. The system of claim 1, wherein the imaging subsystem is further configured to generate the first and second images using light.

17. The system of claim 1, wherein the imaging subsystem is further configured to generate the first and second images using electrons.

18. A non-transitory computer-readable medium, storing program instructions executable on a computer system for performing a computer-implemented method for aligning images of a specimen generated with different modes of an imaging subsystem, wherein the computer-implemented method comprises:

generating a first image and a second image of the specimen with first and second modes, respectively, of the imaging subsystem;

separately aligning the first image and the second image to a design for the specimen;

for a location of interest in the first image, generating a first difference image for the location of interest by subtracting a first reference image for the location of interest from a test image portion of the first image for the location of interest;

generating a second difference image for the location of interest by subtracting a second reference image for the location of interest from a test image portion of the second image for the location of interest;

aligning the first and second difference images to each other; and determining information for the location of interest from results of said aligning the first and second difference images to each other, wherein determining the information comprises verifying if the separately aligning is performed accurately, and wherein said separately aligning, generating the first difference image, generating the second difference image, aligning the first and second difference images, and determining the information are performed by the computer system.

19. A computer-implemented method for aligning images of a specimen generated with different modes of an imaging subsystem, comprising:

generating a first image and a second image of the specimen with first and second modes, respectively, of the imaging subsystem;

separately aligning the first image and the second image to a design for the specimen;

for a location of interest in the first image, generating a first difference image for the location of interest by subtracting a first reference image for the location of interest from a test image portion of the first image for the location of interest;

generating a second difference image for the location of interest by subtracting a second reference image for the location of interest from a test image portion of the second image for the location of interest;

aligning the first and second difference images to each other; and determining information for the location of interest from results of said aligning the first and second difference images to each other, wherein determining the information comprises verifying if the separately aligning is performed accurately, and wherein said separately aligning, generating the first difference image, generating the second difference image, aligning the first and second difference images, and determining the information are performed by one or more computer systems.

* * * * *